United States Patent [19]

Kimura et al.

[11] Patent Number: 5,128,954
[45] Date of Patent: Jul. 7, 1992

[54] IMPREGNATION OF A SOLID FROM THE GAS PHASE

[75] Inventors: Hiroshi Kimura, Northridge; Ricardo C. Pastor, Manhattan Beach, both of Calif.

[73] Assignee: Hughes Aircraft Company, Los Angeles, Calif.

[21] Appl. No.: 627,786

[22] Filed: Dec. 14, 1990

[51] Int. Cl.⁵ .................................................. H01S 3/22
[52] U.S. Cl. ........................................ 372/59; 372/39
[58] Field of Search ................... 376/41, 42; 372/59, 372/39

[56] References Cited

U.S. PATENT DOCUMENTS 4,638,485  1/1987  Gellermann ........................ 372/42

Primary Examiner—Léon Scott, Jr.
Attorney, Agent, or Firm—E. E. Leitereg; V. D. Duraiswamy; W. K. Denson-Low

[57] ABSTRACT

Post-growth gas-impregnation of an ionic crystal is provided to achieve a high level of caged neutral diatomic species or charged diatomic species, where all other internal degrees of freedom of the species, except the vibrational, are frozen. In the former case, the neutral diatomic species (molecules) enter interstitially, while in the latter case, the charged diatomic species (anions) substitute for anions on the crystal lattice. Such a system provides an efficient mid-infrared, solid-state laser that can be pumped by a laser diode. Other uses include magnetic (Faraday) rotators, electro-optic switches, and Q-switches. The impregnation process introduces the species into the host lattice at a temperature below the melting point of the host crystal, and preferably at a phase transition of the crystal, followed by slow cooling. A pressure greater than atmospheric pressure is used to introduce the tenant molecule interstitially, while a pressure of at least 1 atmosphere is used to introduce the dopant anion substitutionally.

30 Claims, No Drawings

IMPREGNATION OF A SOLID FROM THE GAS PHASE

CROSS-REFERENCE TO RELATED APPLICATION

The present application is related to Ser. No. 627,796, filed Dec. 14, 1990, which is directed to gas doping of solids by crystal growth. In the related application, neutral diatomic molecules are used to dope a crystal host, and the doping process is carried at a temperature slightly above the melting point.

BACKGROUND OF THE INVENTION

1. Field of the Invention

The present invention is directed to a gas-phase impregnation process, and, more particularly, to a process for caging a high concentration of diatomic molecules or substituted diatomic anions in solids. The present invention is also directed to uses of the process for fabricating various devices, such as solid-state lasers, magnetic (Faraday) rotators, Q-switches in the mid-IR range, etc.

2. Description of Related Art

Under proper vibrational excitation, a diatomic molecule or substituted diatomic anion caged in a solid such that all other internal degrees of freedom are frozen, other than vibrational, serves as a laser source through a cascade-type relaxation of its excited vibrational states.

The 2 to 5 $\mu$m wavelength region is of interest to the development of solid-state mid-IR lasers. There are many diatomic molecules, as well as diatomic anions, whose fundamental vibration wavelength falls within the given range. However, the use of uncaged neutral molecules for gas laser applications suffers from two drawbacks:

(1) operating pressure must be low, otherwise, the vibrational output is collision-broadened (the lifetime of the excited—vibrational—state should be long compared to the time between collisions); and (2) rotational degrees of freedom are active which provide a source of broadening and an added handle to radiationless relaxation of the excited state (vibrational) (energy stored in the vibrational mode is broken up into small parcels of the rotational modes which, in turn, are decimated further into the even smaller parcels of the translational).

At present, no known state-of-the-art techniques are known which are designed to trap a high concentration of diatomic molecules or diatomic anions in a solid.

SUMMARY OF THE INVENTION

In accordance with the invention, the drawbacks mentioned above are overcome by trapping interstitially a diatomic molecule or by introducing substitutionally a diatomic anion in a solid through gas-phase impregnation of the host (ionic crystal) of the gas that provides the tenant molecule (dopant anion).

The process of the invention introduces a high concentration of a diatomic molecule or diatomic anion into a host crystal, comprising heating the host crystal to a temperature less than the melting point of the crystal in an atmosphere of a gas of the diatomic molecule or a molecule which can dissociate to provide the diatomic anion to achieve adoping concentration of about $10^{19}$ to $10^3$. The former process requires high pressure, while the latter process is simply an exchange reaction.

The first limitation above is avoided because the caged species is well-shielded from the others. The second limitation can be eliminated by choosing the proper size fit between tenant (diatomic molecule or diatomic anion) and host (crystal).

As a result, efficient mid-infrared, solid-state lasers that can be pumped by a laser diode can be packaged in a very compact manner for a variety of uses, including as instruments for monitoring and control of environmental pollution. Further, Faraday rotators and Q-switches operating in the mid-IR may also be fabricated using gas-impregnated solid produced by the process of the invention. For laser applications, the concentration is typically in the range of about $10^{19}$ to $10^{20}$ cm$^{-3}$. For Faraday rotators and Q-switches, the required concentration may extend to $10^{22}$ cm$^{-3}$, which is attainable by the process of the invention.

DESCRIPTION OF THE PREFERRED EMBODIMENTS

In accordance with the invention, diatomic molecules or diatomic anions are trapped in an ionic solid through thermal expansion of the host while under high pressure of the gas that provides the tenant species. This process permits interstitial introduction of the neutral tenant molecule in the host crystal, or, alternatively, substitution of the diatomic anion into the host lattice.

As used herein, the term "diatomic species" is used to describe both diatomic molecules and diatomic anions. The former are neutral, are introduced interstitially and are termed "tenants"; the latter are charged, are introduced substitutionally on the host lattice, and are termed "dopants".

In choosing the proper size fit between diatomic species and host, the host crystal must satisfy three constraints:

(1) the crystal must, of course, be transparent to the output wavelength;

(2) the crystal interstice must be matched to accommodate the van der Waal radius of the tenant species, thereby freezing all internal degrees of freedom, except vibration; and (3) the chosen host lattice must permit a working temperature (below the melting point) where, within a reasonable time scale, impregnation is not limited by diffusion, but rather by the solubility of the gas in the solid.

It is the third constraint which is critical. A high operating temperature is needed so that impregnation of the solid by the neutral diatomic gas is not diffusion-limited. However, by Henry's Law, the higher the temperature for a given working gas pressure of impregnation, the lower the solubility of the gas in the solid. The energy barrier to diffusion can be lowered by using a larger interstice (more correctly, a larger entrance to the interstice). However, this choice is also limited by the second constraint above.

Gas-phase impregnation of a solid by a diatomic anion operates on a different set of constraints than gas-phase impregnation by a diatomic molecule. In the former, a neutral species is not being introduced interstitially (which is a physical process involving solubility), but rather one that is charged and substitutes for one of the host ions (which is a chemical process involving exchange).

Consider a host MX which is desired to be substitutionally impregnated with dopant anion B- from a carrier gaseous compound AB(g), $$MX(c) + \alpha AB(g) \rightleftharpoons MX_{1-\alpha}B_\alpha(c') + \alpha AX(g). \quad (1)$$

Now, (c) stands for the condensed phase of MX, which, when doped with B- becomes (c'), as shown on the product side of Eqn. (1). One cannot calculate the free-energy change corresponding to Eqn. (1) because (c') is not MB(c), the bulk phase of MB; rather, (c') is essentially MX(c) containing a low level of B- in place of X., i.e., a higher entropy situation. Thus, to ensure a forward drive of Eqn. (1), the free energy of reactant gas-compound AB(g) must be high and the free energy of product gas-compound AX(g) must be low. Illustration of this follows.

Consider MX(c) to be a halide such as RbCl or CsCl and B- to be CN-. The choice of gas-reactant AB(g)=$C_2N_2$(g) (cyanogen) would not be good, because while its standard free energy of formation is $\Delta_f G° = +71.1$ kcal, providing a good drive, the standard free energy of formation of the gas product AX(g)=CNCl(g) is +31.3 kcal. However, if AB(g)=ICN(g), then AX(g)=ICl(g). This choice is preferred, because $\Delta_f G° = +47$ kcal for ICN(g) and $-1.3$ kcal for ICl(g). Another preferred choice would be where AB(g) =HCN(g), because $\Delta_f G° = +29.8$ kcal for HCN(g) and $-22.8$ kcal for HCl(g).

It is not possible to define a minimum difference between the two $\Delta G$'s, because the $\Delta G$ for the other half of the reaction (that of (c) versus (c')) is unknown. All that is known is that the algebraic sum of the two $\Delta G$'s must not be too far off from zero (preferably, somewhat negative). The forward displacement of Eqn. (1) is measured by $K = \exp(-\Delta G/RT)$, which shows also the role of temperature.

In the caging of neutral diatomic molecules, the operating temperature is high enough, but below the melting point of the host, so that the dopant level and distribution are solubility-limited, not diffusion-limited. In the neutral case, the energy barrier is high because the neutral dopant must tunnel through from one interstice to the other to transport from the interface to the bulk. In the ion-substitution case, in contrast, the ion-dopant moves from the interface to the bulk by jumping from one ion vacancy to another. At the interface, the ion-dopant is generated by exchange (say, $X^-(c)+AB(g)\rightarrow B^-(c')+AX(g)$), emphasizing the desirability of high free energy AB(g) and low free energy AX(g). The rate of entry depends on the working temperature and on the ion-dopant concentration at the interface layer. Because of the latter consideration, it is preferable to choose a high free-energy drive from the reactant side. The gas-phase is a sink for AX(g); the product-side of Eqn. (1) is in no position to participate in a mass-action reversal of Eqn. (1). It is in this respect that AB(g) =ICN(g) is better than HCN(g). However, the choice of a high free-energy gas reactant, such as ICN(g), limits one to a lower temperature operation. A high free-energy species always presents the possibility of decomposing into low free-energy species:

$$2ICN(g) \rightleftharpoons I_2(g) + (CN)_2(g), \quad (2)$$

$$2HCN(g) \rightleftharpoons H_2(g) + (CN)_2(g). \quad (3)$$

The forward occurrence of Eqn. (2) or (3) is detrimental to the use of AB(g)=ICN(g) or HCN(g) in Eqn. 1. As already shown, $(CN)_2$(g) is not an effective gas-reactant to drive Eqn. (1) forward.

In the sorbed state, the reactant (ICN, HCN) undergoes bond stretch and thereby requires lower kT (than in the gas phase) to dissociate. The resulting radical (CN) is smaller and mobile, to active tunneling and effects an electron-abstraction and site-exchange, $X^-(c)+CN(g)\rightarrow CN^-(c')+X(g)$. If the CN seats into an anion vacancy deep inside, electron-cloud displacement occurs to convert it to CN- at the expense of a high free-energy X-(as that close to the surface) becoming neutral. Dissociation of AB in the gas phase is undesirable, as that favors Eqns. (2) or (3), Now, dissociation occurs at a specific rate $k \approx \nu_{AB}\exp(-\Delta\epsilon/kT)$. It may be assumed that the bond-vibration frequency $\nu_{AB}$ (or the force constant) is approximately unchanged in the ground state. Taking a typical dissociation energy of 50 kcal and adopting an operating temperature of 1,000K (727° C.), it follows that if the sorbed state reduces the dissociation energy by $\approx 20\%$ (a very reasonable value), then dissociation in the sorbed state is $10^2$ times more probable than in the gas phase.

The process of the invention does not limit the operating pressure for laser applications, since the caged molecule is well-shielded from the others. Further, rotational degrees of freedom are frozen, due to the judicious choice of tenant and host, based on the considerations given above.

The method of the invention preferably involves the use of high-pressure apparatus which can operate to at least about 1,500° C. under gas pressures up to at least about 150 atm for the interstitial introduction of neutral diatomic molecules.

Examples of suitable tenant molecules (neutral species) and dopant anions (charged species) useful in the practice of the invention are listed in Table I below, together with their $\lambda_f$ (fundamental vibration wavelength) in the 2 to 5 $\mu$m range of interest and $r_\nu$ (van der Waal radius):

TABLE I

| Examples of Diatomic Molecules. | | |
|---|---|---|
| species | $\lambda_f$, $\mu$m | $r_\nu$, Å |
| $H_2$ | 2.27 | 1.38 |
| $D_2$ | 3.20 | 1.38 |
| HCl | 3.34 | 1.59 |
| HBr | 3.78 | 1.64 |
| $N_2$ | 4.24 | 1.57 |
| CO | 4.61 | 1.58 |
| NO | 5.25 | 1.40 |
| CN- | 4.88 | 1.81 |
| SH- | — | 1.95 |
| OD- | — | — |
| OH- | — | 1.40 |

With the foregoing tenants, the following ionic metal halides are good candidate host materials. Table II lists the crystal, its crystal structure (fcc=face-center cubic; sc=simple cubic), the $r_i$ (interstitial size) and mp (melting point).

TABLE II

| Examples of Host Materials. | | | |
|---|---|---|---|
| Crystal | Structure | $r_i$, Å | mp, °C. |
| LiF | fcc | 1.38 | 842 |
| LiCl | fcc | 1.88 | 614 |
| NaF | fcc | 1.94 | 988 |
| KF | fcc | 1.91 | 846 |
| CsI | sc | 1.35 | 621 |

TABLE II-continued

| Crystal | Examples of Host Materials. | | |
|---|---|---|---|
| | Structure | $r_i$, Å | mp, °C. |
| Tll | sc | 1.24 | 440* |

*Metastable state is orthorhombic, which changes to sc on cooling.

The interstitial size is matched to the size of the tenant species. The tenant species goes into the host additively. For substitution, the size of the anion species is matched to the size of the replaced anion. In either case, the species must be "locked in" to prevent translational and rotational modes, allowing only vibrational modes.

The foregoing Tables provide an indication of examples of suitable hosts and tenant molecules (dopant anions). The crystal host may comprise any of the Group I, II, III and IV halides, Group III-V oxides, and silicon and germanium. Examples of Group I halides are given in Table II. Examples of Group II halides include barium halides. Examples of Group III halides include rare-earth halides. Examples of Group IV halides include Ti, Zr, and Hf halides. Examples of III-V oxides include yttrium vanadate, aluminum phosphate, etc.

In selecting a suitable host, it must also be transparent to the pump radiation as well as to the vibrational emission of the tenant molecule (dopant anion). Determination of the extent of transparency required is readily done, once the host material and tenant molecule (dopant anion) are known.

The size of the tenant molecule must be reasonably matched to the interstitial opening in the host crystal, while the size of the dopant anion must be reasonably matched to the size of the replaced anion. However, the tenant (dopant) can be somewhat larger, although this will create some strain in the host lattice. The ratio of the size of the opening to the size of the tenant (or ratio of the size of departing anion to the size of the replacing anion) may vary ±15%; the selection is advantageously based on the values given in A. Goldsmith, *Handbook of Thermophysical Properties of Solid Materials*, The MacMillan Company, New York (1961).

A diatomic molecule has six degrees of freedom: three translational, two rotational, and one vibrational. Molecules with more than two atoms have more than one vibrational degree of freedom, and thus are not useful in the practice of the invention. In order to construct a laser operating in the infrared, only those diatomic species that vibrate in the infrared are useful; these are listed in Table I above.

The concentration range of the tenant (dopant) species in the host crystal may range from about $10^{19}$ to $10^{20}$ cm$^{-3}$ for laser applications. If the concentration is larger than $10^{20}$ cm$^{-3}$, then quenching of the emission will occur. However, higher concentrations of the species may be useful in other devices, described in further detail below.

It will be appreciated that these gas molecules presently lase only in millimeter pressures; higher pressures decrease lasing due to collisions, as indicated earlier. A concentration of the tenant molecule (dopant species) of about $10^{19}$ cm$^{-3}$ in a solid is equivalent of 1 atm. Thus, it will be seen that with a substantially increased concentration of the diatomic species, then the output intensity increases with concentration as long as the pumping source can meet the demand for excitation. Otherwise, the inner part of the material will not lase. The unexcited fraction can (by resonance absorption) trap the output radiation and give the pulse output a "long tail". Yet, there is no pressure broadening, since the molecules are caged.

The process for introducing the neutral tenant is as follows: A high pressure furnace or pressure vessel is employed. The crystal or solid host is placed in a crucible and heated to a temperature below the melting point in the presence of about 50 to 60 atm of the neutral diatomic gaseous tenant. The solid is held at that temperature and pressure for a period of time to permit equilibration in the dissolution of the tenant in the host. A suitable time is on the order of one hour. The crystal or solid is then slowly cooled under high pressure.

The pressure is not particularly critical, and may vary, depending on temperature. The Henry-Law constant is $k_H = C(solid)/C(gas)$, where $C(gas) = (PN_O)/RT$, with $T < T_{mp}$ of the host material. $C(solid)$ is given by $$C(solid) = k_H \frac{P(atm)}{T} \times \frac{6.02 \times 10^{23}}{82.05.}$$

Using as reference $C(solid) = 10^{19}$ cm$^{-3}$ and $k_H = 0.1$, then $P(atm)/T = 8.205 \times 10^{21}/6.02 \times 10^{23} = 0.0136$. Thus, for $T = 1,000$K, the required gas pressure is $P = 13.6$ atm, but if $k_H = 1$, then $P = 136$ atm, etc. Thus, after a choice of working temperature, the value of P is based on (a) the target value of $C(solid)$ and (b) what is the anticipated $k_H$ value.

The cooling is dependent on the size of the crystal or solid, and is conveniently done overnight or all day long for 50 to 100 g pieces.

The process for introducing the anionic dopant employs processing similar to that given above, except that the process may be at any pressure of 1 atm or greater. Also, the species providing the anion is diluted by an inert atmosphere, in order to minimize encounters between the molecular species. For example, in exchanging Cl$^-$ of a crystal with CN$^-$ in the reaction ICN(g) + Cl$^- \rightarrow$ CN$^-$ + ICl, it is important to reduce collisions between ICN + ICN, which produces I$_2$ + C$_2$N$_2$, thereby defeating the substitution reaction.

In this latter process, at a given temperature, the forward speed of exchange depends on the collision frequency of the exchanging species at the interface and goes as $P/T^{\frac{1}{2}}$, where P is the partial pressure. However, the reverse u speed of the exchange goes as $1/P_t$, where $P_t$ is the total pressure. Typically, the gaseous species is present in an amount of about 1 to 10% in the inert gas. Examples of suitably employed inert gases include helium and argon.

For host crystals which evidence a phase transition temperature, it is preferred to heat the crystal to that temperature. Phase transition means unusual mobility of the host species during structural rearrangement. Thus, the host will exhibit maximum penetrability in this thermal range. However, the invention is not limited to operating at that temperature. For host crystals which do not evidence a phase transition temperature, then the process is operated at whatever pressure the pressure vessel can accommodate at a temperature just below the melting point of the host, subject to the considerations given above. It is advantageous to start with a high pressure to increase the initial kinetics, but if the pressure of the closed system drops significantly, then $k_H$ should be calculated to a better approximation. Then, the pressure is reduced to a value commensurate with the target value of $C(solid)$.

A pressure of 60 atm is equivalent to a particle density of $\approx 10^{21}$ cm$^{-3}$. Thus, it is desired to achieve a partition $k_H$ (ratio of particle density caged in the crystal to that in air) of at least $\approx 10^{-2}$. With no phase transition intervening, $k_H$ increases with pressure P and decreases with an increase in temperature T. The P,T-tradeoff must be gauged for each case. That will then determine the choice of the pressure vessel, which also has a P,T-tradeoff in its performance limit.

TGA analysis shows that the gas stays in the solid at all temperatures below the melting point of the solid host.

The foregoing description has been presented largely in terms of using the molecularly-caged material in laser applications. However, other applications are also possible with these materials.

For example, such materials may be applied to act as magnetic (Faraday) rotators at wavelengths not far removed from the fundamental absorption of the tenant molecule. Consider the caging of NO in a crystal matrix at a level of $10^{21}$ to $10^{22}$ cm$^{-3}$. When such a material is subjected to a magnetic field, there is a tendency to line up the magnetic dipoles, competing with the disordering tendency of the thermal state (measured by kT). Of course, the extent of lining up of the dipoles improves as the material is cooled. The oscillating magnetic vector of the material acts on the oscillating magnetic field of the electromagnetic wave, resulting in a turning of the plane of polarization. The effect becomes very big when the two oscillations are closely-matched in frequency (i.e., resonance). We may consider three such circuit elements: (1) a laser of caged-NO of $\approx 10^{19}$ cm$^{-3}$ operating at 5.25 μm; (2) another caged-NO system of $\approx 10^{20}$ cm$^{-3}$ to Q-switch (i.e., obtain giant laser pulses); and (3) another caged-NO system at low temperature and with a magnetic field to define the direction and to rotate the plane of polarization of the laser pulse.

Consider now a material where the cage diatomic has a sizable electric dipole moment. The lining up of this dipole will cause the refractive index to change with the applied electric field. Thus, one has an electro-optic switch.

This class of materials may also find application as a passive Q-switch, or a bleachable absorber. Consider a crystal matrix where CO molecules have been caged to a level of $10^{21}$ to $10^{22}$ cm$^{-3}$. This material provides a solid which potentially can Q-switch CO gas lasers at 4.6 μm to produce giant pulses, as described above for NO.

What is claimed is:

1. A process for introducing a high concentration of a charged polyatomic species into a host crystal, comprising heating said host crystal in an atmosphere of a gas of said charged polyatomic species to a temperature below said host crystal's melting point and below said charged polyatomic species' decomposition temperature to maintain thermal stability of said charged polyatomic species and under a pressure sufficient to achieve a doping concentration of about $10^{19}$ to $10^{22}$ cm$^{-3}$.

2. The process of claim 1, wherein said crystal includes an anionic species that is replaced by said charged polyatomic species, said charged polyatomic species having a van der Waal radius which is within ±15% of that of said anionic species and said process is carried out at a pressure of at least one atmosphere, with said charged polyatomic species derived from a gas diluted by an inert gas.

3. The process of claim 2 wherein said inert gas is selected from the group consisting of helium and argon and said diluted gas is present in an amount ranging from about 1 to 10%.

4. The process of claim 3, wherein said host crystal is selected from the group consisting of LiF, LiCl, NaF, KF, CsI, TlI, barium halides, rare-earth halides, Ti, Zr, and Hf halides, yttrium vanadate and aluminum phosphate.

5. The process of claim 1 wherein said host crystal is selected from the group consisting of Group I halides, Group II, halides, Group III halides, Group IV halides, Group III-V oxides, silicon, and germanium.

6. The process of claim 1 wherein said charged polyatomic species is selected from the group consisting of CN−, SH−, OD−, and OH−.

7. The process of claim 1 wherein said host crystal is heated to a temperature below its melting point and held at said temperature and said pressure for a period of time.

8. The process of claim 7 wherein for said host having a phase transition temperature, said host is heated to said phase transition temperature.

9. Product produced by the process of claim 1.

10. A process of preparing a solid-state device for operation in the mid-infrared region, including introducing a high concentration a charged polyatomic species into a host crystal, comprising heating said host crystal to a temperature below said host crystal's melting point and below said charged polyatomic species' decomposition temperature to maintain thermal stability of said charged polyatomic species and under a pressure sufficient to achieve a doping concentration of about $10^{19}$ to $10^{22}$ cm$^{-3}$.

11. The process of claim 10 wherein said crystal includes an anionic species that is replaced by said charged polyatomic species, said charge polyatomic species having a van der Waal radius which is within ±15% of that of said anionic species and said process is carried out at a pressure of at least one atmosphere, with said charged polyatomic species derived from a gas diluted by an inert gas.

12. The process of claim 11 wherein said inert gas is selected from the group consisting of helium and argon and said diluted gas is present in an amount ranging from about 1 to 10%.

13. The process of claim 10 wherein said host crystal is selected from the group consisting of Group I halides, Group II, halides, Group III halides, Group IV halides, Group III-V oxides, silicon, and germanium.

14. The process of claim 10 wherein said host crystal is selected from the group consisting of LiF, LiCl, NaF, KF, CsI, TlI, barium halides, rare-earth halides, Ti, Zr, and Hf halides, yttrium vanadate and aluminum phosphate.

15. The process of claim 10 wherein said charged polyatomic species is selected from the group consisting of CN−, SH−, OD−, and OH−.

16. The process of claim 10 wherein said host crystal is heated to a temperature below its melting point and held at said temperature and said pressure for a period of time.

17. The process of claim 16 wherein for said host having a phase transition temperature, said host is heated to said phase transition temperature.

18. Product produced by the process of claim 10.

19. A solid-state laser operating in the mid-infrared region comprising a solid laser host material having incorporated therein a charged polyatomic species in a concentration ranging from about $10^{19}$ to $10^{20}$ cm$^{-3}$, wherein said charged polyatomic species is incorporated as a gas under a pressure sufficient to achieve said concentration and at a temperature below said host laser material's melting point and below said charged polyatomic species' decomposition temperature to maintain thermal stability of said charged polyatomic species.

20. The laser of claim 19 wherein said crystal has interstices that are within ±15% of the van der Waal radius of said diatomic species.

21. The laser of claim 19 wherein said crystal includes an anionic species that is replaced by said charged polyatomic species, said charge polyatomic species having a van der Waal radius which is within ±15% of that of said anionic species.

22. The laser of claim 19 wherein said host crystal is selected from the group consisting of Group I halides, Group II, halides, Group III halides, Group IV halides, Group III-V oxides, silicon, and germanium.

23. The laser of claim 22 wherein said host crystal is selected from the group consisting of LiF, LiCl, NaF, KF, CsI, TlI, barium halides, rare-earth halides, Ti, Zr, and Hf halides, yttrium vanadate and aluminum phosphate.

24. The laser of claim 19 wherein said charged polyatomic species is selected from the group consisting of CN−, SH−, OD−, and OH−.

25. A solid-state device comprising a solid host material having incorporated therein a charged polyatomic species in a concentration ranging from about $10^{19}$ to $10^{22}$ cm$^{-3}$, wherein said charged polyatomic species is incorporated as a gas under a pressure sufficient to achieve said concentration and at a temperature below said host material's melting point and below said charged polyatomic species' decomposition temperature to maintain thermal stability of said charged polyatomic species, and wherein said polyatomic species has a sizable electric dipole moment and said host material, upon application of an electric field, experiences a change in its refractive index to form an electro-optic switch.

26. The device of claim 25 wherein said crystal includes an anionic species that is replaced by said charged polyatomic species, said charge polyatomic species having a van der Waal radius which is within ±15% of that of said anionic species.

27. The device of claim 25 wherein said host crystal is selected from the group consisting of Group I halides, Group II halides, Group III halides, Group IV halides, Group III-V oxides, silicon, and germanium.

28. The device of claim 27 wherein said host crystal is selected from the group consisting of LiF, LiCl, NaF, KF, CsI, TlI, barium halides, rare-earth halides, Ti, Zr, and Hf halides, yttrium vanadate and aluminum phosphate.

29. The device of claim 25 wherein said charged polyatomic species is selected from the group consisting of CN−, SH−, OD−, and OH−.

30. A solid-state device comprising a solid host material having incorporated therein a charged polyatomic species in a concentration ranging from about $10^{31}$ to $10^{22}$ cm$^{-3}$ and said host material, upon subjection to a magnetic field, comprises a magnetic rotator, wherein said charged polyatomic species is incorporated as a gas under a pressure sufficient to achieve said concentration and at a temperature below said host material's melting point and below said charged polyatomic species' decomposition temperature to maintain thermal stability of said charged polyatomic species.

* * * * *